(12) United States Patent
Gifford et al.

(10) Patent No.: US 8,968,063 B2
(45) Date of Patent: Mar. 3, 2015

(54) VENT INSTALLATION METHOD

(75) Inventors: Robert B. Gifford, Newark, DE (US);
Michael Keough, Lincoln University, PA (US)

(73) Assignee: W. L. Gore & Associates, Inc., Newark, DE (US)

( * ) Notice: Subject to any disclaimer, the term of this patent is extended or adjusted under 35 U.S.C. 154(b) by 289 days.

(21) Appl. No.: 13/107,153

(22) Filed: May 13, 2011

(65) Prior Publication Data

US 2011/0294414 A1   Dec. 1, 2011

Related U.S. Application Data

(60) Provisional application No. 61/334,282, filed on May 13, 2010.

(51) Int. Cl.
| | | |
|---|---|---|
| *F24F 7/00* | (2006.01) |
| *F24F 13/06* | (2006.01) |
| *B21D 39/03* | (2006.01) |
| *H05K 5/02* | (2006.01) |
| *F21S 8/10* | (2006.01) |
| *F21V 31/03* | (2006.01) |

(52) U.S. Cl.
CPC ............ *H05K 5/0213* (2013.01); *F21S 48/332* (2013.01); *F21V 31/03* (2013.01)
USPC .............. 454/339; 454/259; 454/309; 29/428

(58) Field of Classification Search
USPC ......................................................... 454/339
See application file for complete search history.

(56) References Cited

U.S. PATENT DOCUMENTS

| | | | | |
|---|---|---|---|---|
| 4,932,315 | A | * | 6/1990 | Dixon ........................... 454/164 |
| 5,116,650 | A | | 5/1992 | Bowser |
| 6,506,110 | B1 | | 1/2003 | Borisch |
| 6,929,542 | B1 | * | 8/2005 | Stravitz ......................... 454/307 |
| 2009/0268475 | A1 | * | 10/2009 | Ball et al. ...................... 362/373 |
| 2010/0262168 | A1 | * | 10/2010 | Khairkhahan et al. ........ 606/151 |

FOREIGN PATENT DOCUMENTS

| | | |
|---|---|---|
| DE | 23 18 746 | 10/1974 |
| WO | WO 98/31966 | 7/1998 |
| WO | WO 99/29150 | 6/1999 |

OTHER PUBLICATIONS

International Search Report for PCT/US2011/036425.

* cited by examiner

*Primary Examiner* — Steven B McAllister
*Assistant Examiner* — Helena Kosanovic
(74) *Attorney, Agent, or Firm* — Amy L. Miller

(57) ABSTRACT

A method for installation of an adhesive vent over an aperture in a surface is described, the adhesive vent has at least one substantially straight serrated edge and an air permeable venting region, an adhesive region having adhesive disposed thereon surrounding the air permeable venting region. The method comprises providing an edge guide adjacent to the aperture, the edge guide adapted to inhibit motion in at least one direction on the surface, positioning the serrated edge on the surface such that the edge of the adhesive vent engages with the edge guide and pressing the adhesive vent onto the surface such that the air permeable region of the adhesive vent covers the aperture and the adhesive vent is fixed to the surface by the adhesive.

11 Claims, 6 Drawing Sheets

US 8,968,063 B2

VENT INSTALLATION METHOD

RELATED APPLICATIONS

This application claims priority to and the benefit of U.S. Provisional Patent Application No. 61/334,282 filed May 13, 2010, entitled "VENT INSTALLATION METHOD," which application is incorporated herein by reference in its entirety.

FIELD OF THE INVENTION

The present invention relates to improved installation methods for flexible adhesive components. For example, in one embodiment the invention is useful in adhesive vents where water vapor has to pass through while being a barrier to liquid water and other contaminants like particulate matter. Often such vents must be precisely placed over the hole in an enclosure. Specifically, the present invention relates to an improved method of installation of a vent in an automotive lamp enclosure.

BACKGROUND OF THE INVENTION

Many vehicle lamps may be equipped with venting systems to reduce condensation. One such system comprises an adhesive vent comprising a porous venting material attached over an aperture on the lamp enclosure by means of an adhesive. Many such venting systems are attached to the lamp enclosure by a manual process i.e. manually pick and place the adhesive vent on to a target frame that is provided on the lamp enclosure. A common occurrence in these systems is misalignment of the vent on the target frame due to the very short installation time (typically to the order of a few seconds) available. This could result in improper attachment of the vent, thereby causing a leak path around the vent. Such a leak path could impact the performance of the vent in a negative manner. Therefore, a need exists for an installation method to accurately place the vent on to the lamp enclosure. The present invention fulfills this need and also provides an easier installation method. The invention has application beyond automotive lamp enclosures. Other examples where the invention may be useful include electronic enclosures wherein adhesive vents for pressure equalization are used or other applications in which flexible adhesive components must be placed accurately upon a surface.

BRIEF DESCRIPTION OF THE DRAWINGS

The advantages of the invention are more fully understood from the associated figures and descriptions.

DESCRIPTION OF THE INVENTION

Figure 1A:
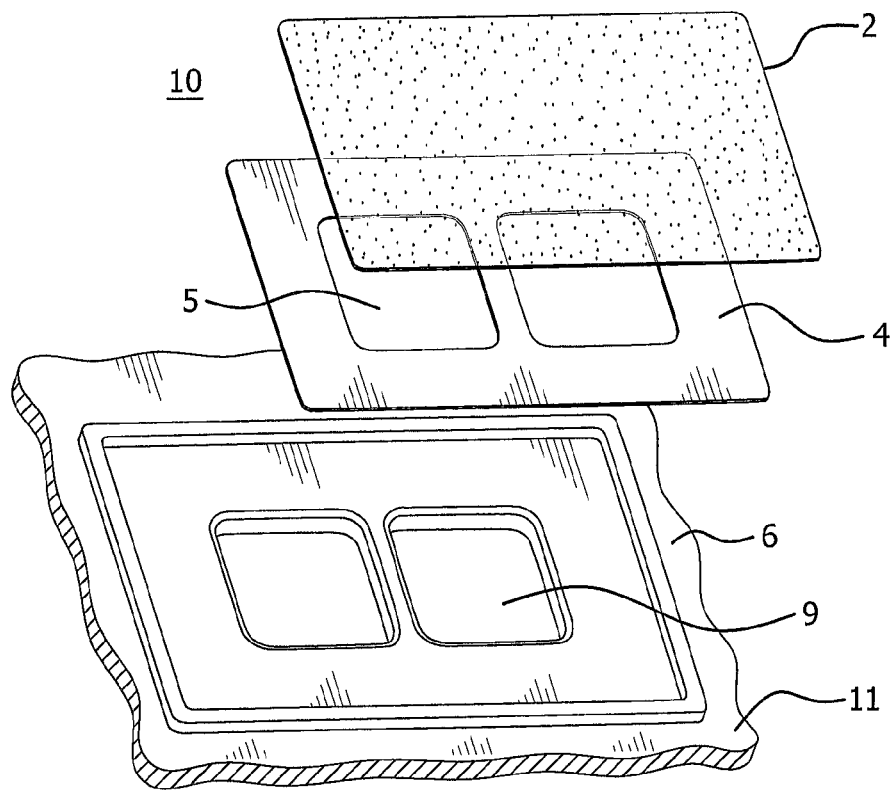
FIG. 1a & FIG. 1b show an exploded and perspective view of a conventional vent installed on a target frame.
Figure 1B:
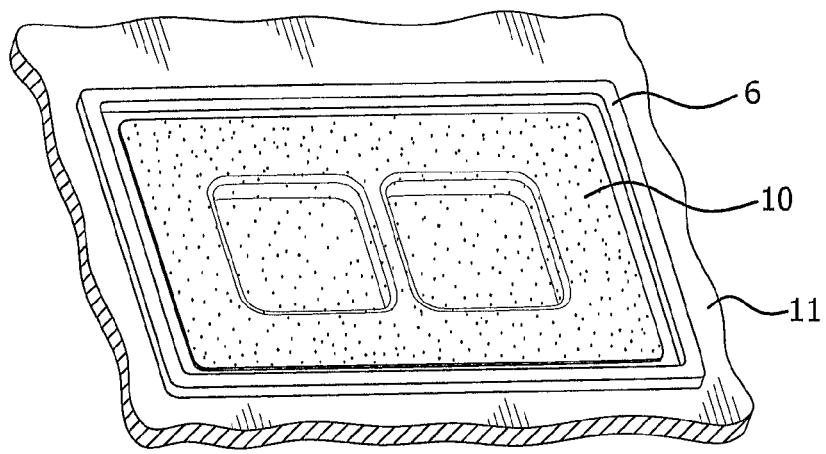

Conventionally, adhesive vents may be installed on an enclosure in the manner depicted in FIGS. 1a and 1b. FIG. 1a is an exploded view of the vent 10. FIG. 1b shows the vent 10 installed on the enclosure wall 11. A vent 10 comprises a venting element 2 and an adhesive 4. Adhesive 4 has apertures 5 which correspond with openings 9 in an enclosure wall 11. The adhesive 4 may be a double sided adhesive applied to a carrier. The adhesive 4 is combined with the venting element 2 prior to installation. In order to properly place the vent 10 so that the apertures 5 in the adhesive align with the openings in the enclosure wall 11, a target frame 6 may be provided. The vent 10 is placed within the target frame 6.

Figure 2A:
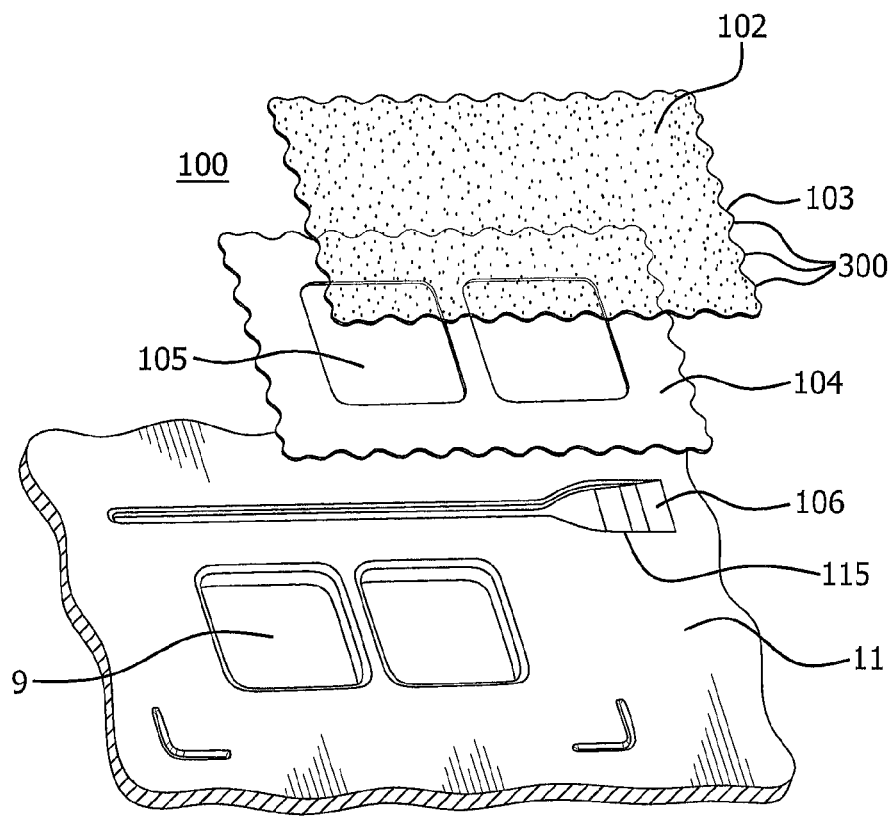
FIG. 2a & FIG. 2b depict an exploded and perspective view of one embodiment of the invention.
Figure 2B:
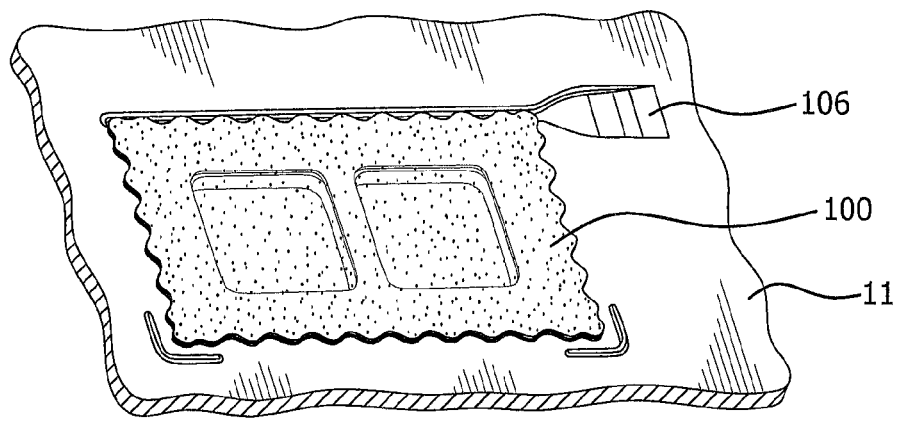

In one embodiment, the invention comprises a system for installation of an adhesive vent over an aperture of an enclosure. As depicted in FIGS. 2a and 2b, A vent 100 comprises a venting element 102 and an adhesive 104. Adhesive 104 has apertures 105 which correspond with openings 9 in an enclosure wall 11. The adhesive 104 may be a double sided adhesive 104 applied to a carrier. The adhesive 104 is combined with the venting element 102 prior to installation. FIG. 2a shows an exploded view of the vent 100 and FIG. 2b shows the vent 100 installed on the enclosure wall.

The venting element may comprise any porous material that is air permeable and moisture impermeable and allows for venting, but prevents intrusion of water and other liquids. The venting element may be advantageously constructed of PTFE membrane. The PTFE material may be rendered oleophobic by methods known in the art. Such methods may be described in U.S. Pat. No. 5,116,650. The membrane may be supported by any suitable support material where necessary. The venting element covers the opening and prevents liquid intrusion into the enclosure. The venting element is attached to a double-sided pressure sensitive adhesive 4. One side of the adhesive is attached to the venting element and the other side is attached to the enclosure.

The vent 100 has at least one edge 103 having serrations 300. As used herein, a serration is wavy or jagged feature on an edge such that the measured length of the edge is greater than the distance between the end points that define the edge. Serrations may minimize the adhesive area at the exposed edge of the vent. By minimizing the adhesive area, the vent is more readily slid over the surface upon which it is mounted. The vent may also be repositioned without sacrificing the final bond strength. Any number of serrations 300 may be formed on the edge 103 of the adhesive vent. The serration 300 may take any shape or size. Some exemplary edge profiles are shown in FIG. 4. Non-limiting examples include serration 300 which is, sinusoidal 301 or other curves 302, castellated 303, tabs 304 or notching 305, and multiple peaks 306. The adhesive vent itself may take any geometric shape.

In one embodiment, the installation guide 106 may be a groove as shown in FIGS. 2a and 2b. One or both ends of the groove may have an area of wider dimension 115 than the width of the groove itself. The installation guide 106 and the serrated edge of the adhesive vent facilitate quick and accurate installation. The groove may be created on the surface of an enclosure by methods known in the art.

Figure 3A:
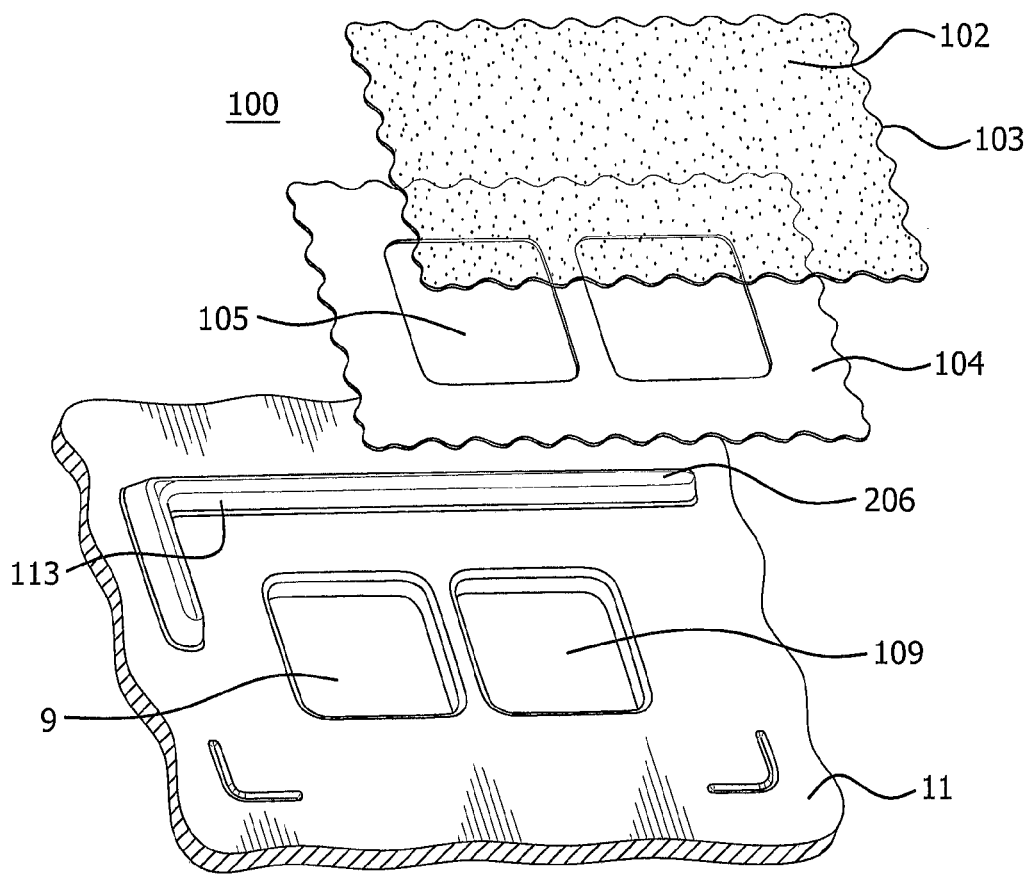
FIG. 3a & FIG. 3b depict an exploded and perspective view of another embodiment of the invention.
Figure 3B:
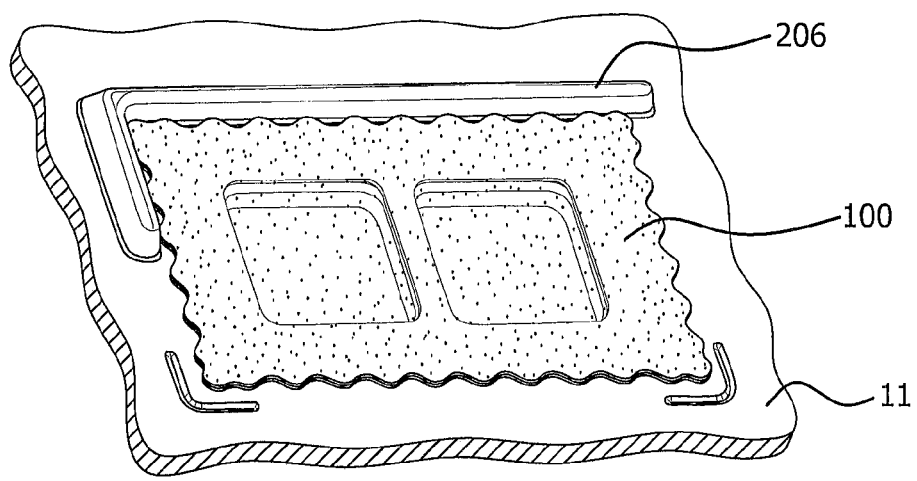
Figure 4A:
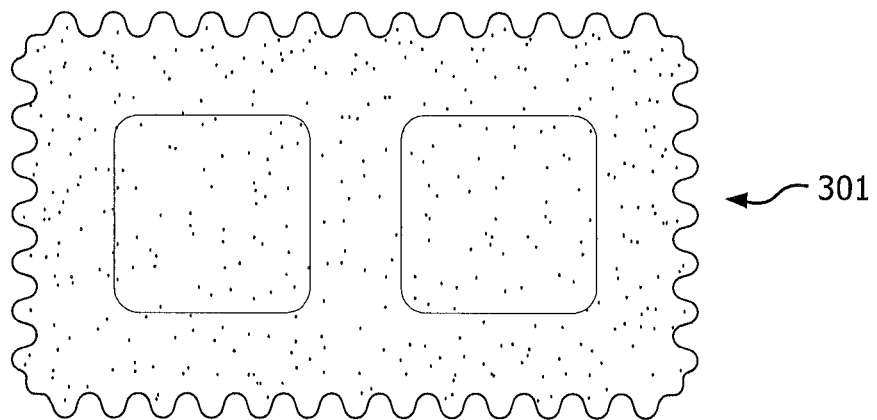
FIGS. 4a-4f shows various examples of possible serrated edge configurations.
Figure 4B:
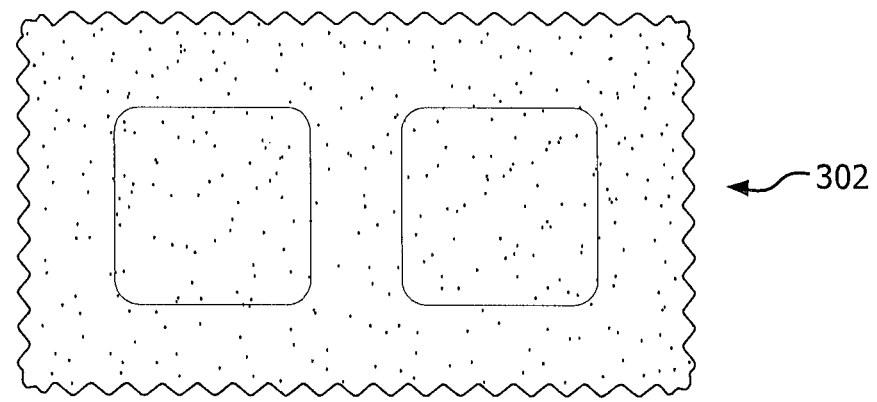
Figure 4C:
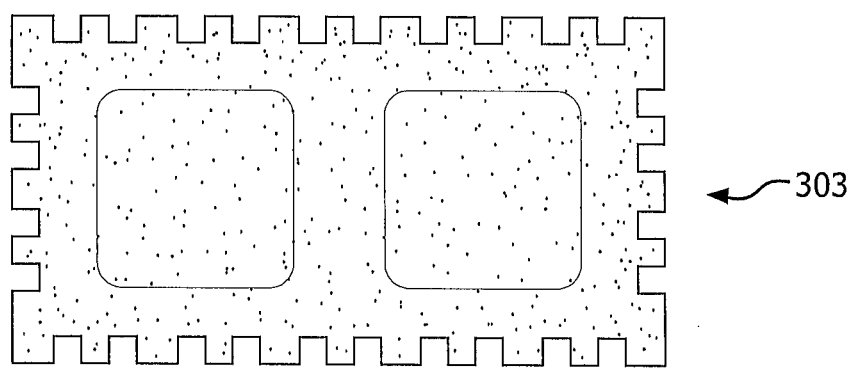
Figure 4D:
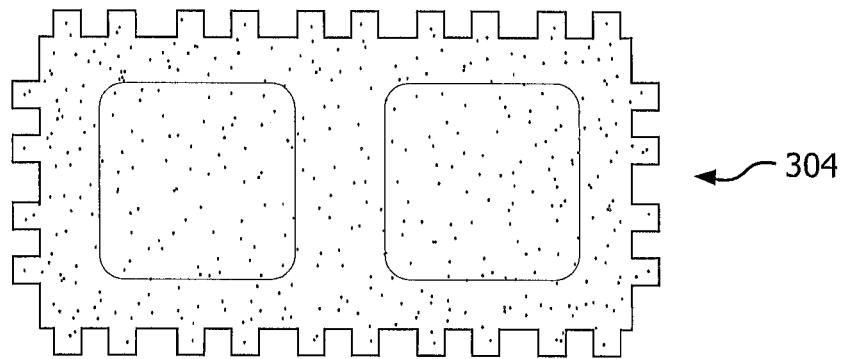
Figure 4E:
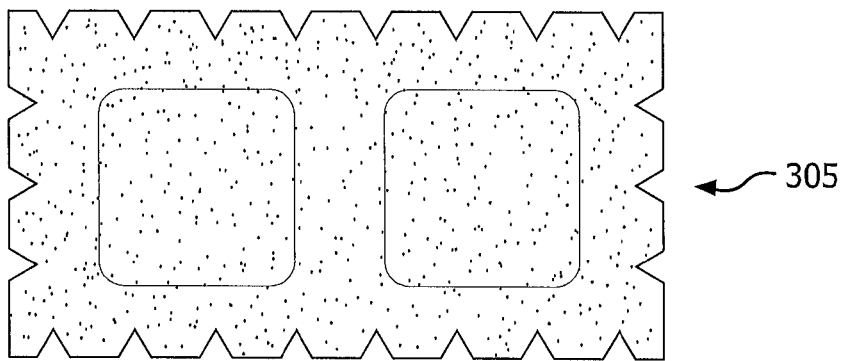
Figure 4F:
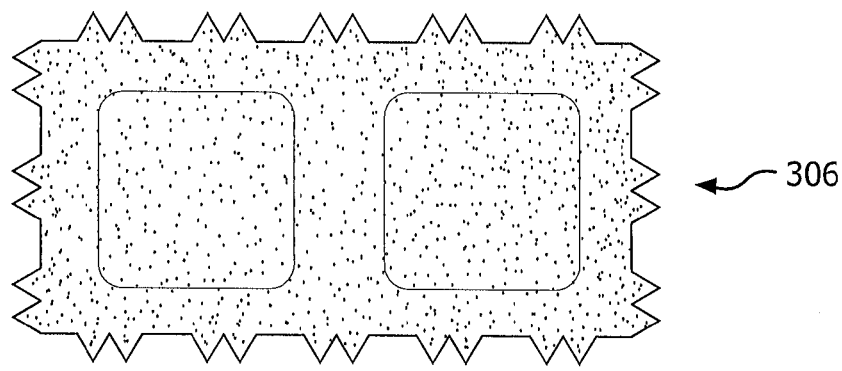

In another embodiment, the installation guide 206 may be a ridge or boss. As shown in FIG. 3a, the ridge may be provided as an L-shaped feature to aid positioning of the adhesive vent on the enclosure. An installation guide 206 is disposed on the surface of the container wall and adjacent to the opening 9, the installation guide 206 having at least one bearing face 113. The installation guide 206 may be provided as a separate component or may be incorporated into the wall of the enclosure itself by methods known in the art. When the installation guide 206 is a separate component, it is provided with one or more aperture(s) to align with the opening on the enclosure.

Figure 5A:
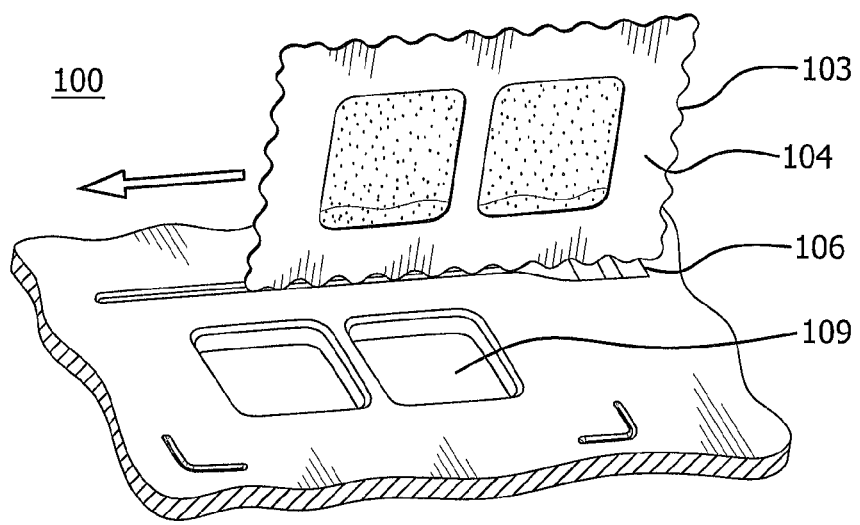
FIG. 5a-5c illustrates the steps involved in the improved installation method of the invention.
Figure 5B:
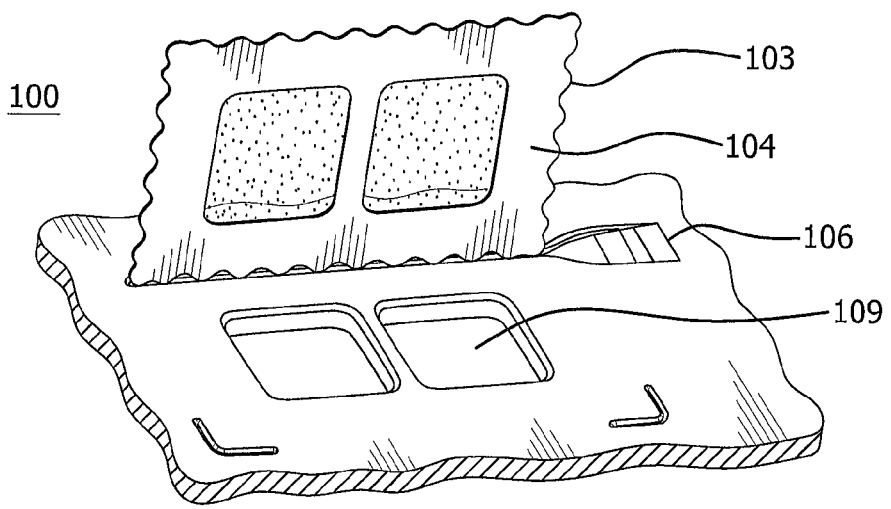
Figure 5C:
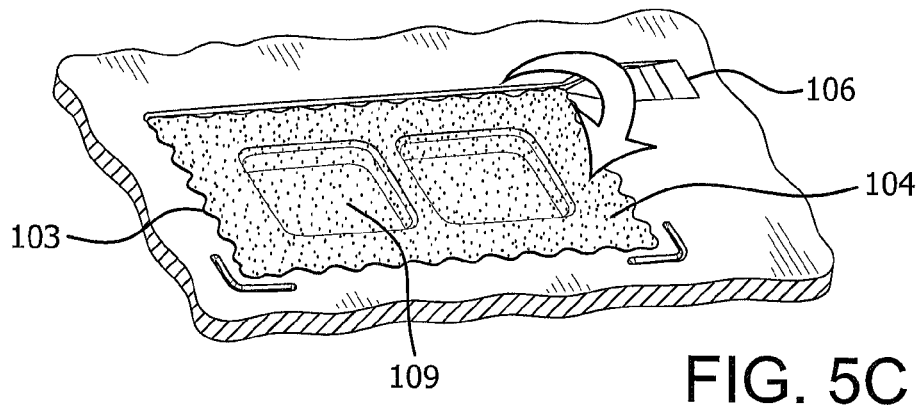

FIG. 5a-5c depict the sequence of installing the vent 100 using the installation guide 106 of one embodiment. The vent 100 is installed by inserting an edge 103 with serration 300 into the installation guide 106. The installation guide 106 shown reflects optional wider end 115 which may improve the ease of insertion of the vent 100 into the installation guide 106. In FIG. 5b, the vent 100 is positioned laterally to align vent 100 apertures with the openings in the enclosure wall. Finally, as reflected in FIG. 5c, the vent 100 is pressed down over the openings 109 to seal them and provide a waterproof, breathable barrier to the enclosure.

What is claimed is:

1. A method for installation of an adhesive vent over an aperture in a surface, the adhesive vent having at least one serrated edge, an air permeable venting region, and an adhesive region having adhesive disposed thereon surrounding the air permeable venting region, the method comprising:
    positioning the adhesive vent near a first end of an edge guide adjacent to the aperture, the edge guide including a groove to inhibit motion of the adhesive vent in at least one direction on the surface, while not inhibiting motion of the adhesive vent in at least one other direction,
    positioning the adhesive vent such that the edge of the adhesive vent engages with the edge guide, and
    moving the adhesive vent along the edge guide from the first end of the edge guide towards a second end of the edge guide while maintaining the remainder of the adhesive vent in a position that prevents the adhesive from adhering to the surface, and such that the air permeable region of the adhesive vent is aligned with the aperture,
    pressing the adhesive vent onto the surface by rotating the adhesive vent about an axis defined by the edge guide such that the air permeable region of the adhesive vent covers the aperture and the adhesive vent is fixed to the surface by the adhesive.

2. The method for installation according to claim 1, wherein said venting region comprises a porous material that is air permeable and moisture impermeable.

3. The method for installation according to claim 2, wherein the porous material comprises a PTFE membrane.

4. The method for installation according to claim 3, wherein the PTFE membrane is oleophobic.

5. The method for installation according to claim 1, wherein the edge guide includes a groove having at least one enlarged end.

6. The method for installation according to claim 1, wherein the venting region is defined by a porous venting element that is air permeable and moisture impermeable, wherein the adhesive region is defined by an adhesive comprising a double-sided adhesive applied to a carrier, and wherein the adhesive is combined with the venting element prior to installation.

7. A method for installation of an adhesive vent over an aperture in a surface, the adhesive vent having at least one serrated edge, an air permeable venting region, and an adhesive region having adhesive disposed thereon surrounding the air permeable venting region, the method comprising:
    positioning the adhesive vent near a first end of an edge guide adjacent to the aperture, the edge guide including a ridge to inhibit motion of the adhesive vent in at least one direction on the surface, while not inhibiting motion of the adhesive vent in at least one other direction,
    positioning the adhesive vent such that the edge of the adhesive vent engages with the edge guide and moving the adhesive vent along the edge guide from the first end of the edge guide towards a second end of the edge guide while maintaining the remainder of the adhesive vent in a position that prevents the adhesive from adhering to the surface, and such that the air permeable region of the adhesive vent is aligned with the aperture,
    pressing the adhesive vent onto the surface by rotating the adhesive vent about an axis defined by the edge guide such that the air permeable region of the adhesive vent covers the aperture and the adhesive vent is fixed to the surface by the adhesive wherein the edge geode includes a ridge having an L-shaped configuration for stopping the adhesive vent adjacent the edge guides second end.

8. The method for installation according to claim 7, wherein said venting region comprises a porous material that is air permeable and moisture impermeable.

9. The method for installation according to claim 8, wherein the porous material comprises a PTFE membrane.

10. The method for installation according to claim 9, wherein the PTFE membrane is oleophobic.

11. The method for installation according to claim 7, wherein the venting region is defined by a porous venting element that is air permeable and moisture impermeable, wherein the adhesive region is defined by an adhesive comprising a double-sided adhesive applied to a carrier, and wherein the adhesive is combined with the venting element prior to installation.

* * * * *